(12) United States Patent
Takanami et al.

(10) Patent No.: US 10,342,169 B2
(45) Date of Patent: Jul. 2, 2019

(54) TAPE FEEDER

(71) Applicant: Panasonic Intellectual Property Management Co., Ltd., Osaka (JP)

(72) Inventors: Yasuo Takanami, Yamanashi (JP); Chikara Takata, Yamanashi (JP); Yasuo Oku, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 130 days.

(21) Appl. No.: 15/373,804

(22) Filed: Dec. 9, 2016

(65) Prior Publication Data
US 2017/0231126 A1  Aug. 10, 2017

(30) Foreign Application Priority Data
Feb. 4, 2016 (JP) .................. 2016-019870

(51) Int. Cl.
*H05K 13/02* (2006.01)
*B65H 20/20* (2006.01)
*H05K 13/04* (2006.01)

(52) U.S. Cl.
CPC ........... *H05K 13/021* (2013.01); *B65H 20/20* (2013.01); *H05K 13/0419* (2018.08)

(58) Field of Classification Search
CPC ........ B65H 20/20; B65H 20/22; H05K 13/02; H05K 13/0417
See application file for complete search history.

(56) References Cited

U.S. PATENT DOCUMENTS

| | | | | |
|---|---|---|---|---|
| 6,557,850 B1* | 5/2003 | Kallin | ...................... | B65H 5/36 271/264 |
| 2013/0319621 A1* | 12/2013 | Takata | ................... | H05K 13/02 156/750 |

FOREIGN PATENT DOCUMENTS

| | | |
|---|---|---|
| CN | 103416114 A | 11/2013 |
| JP | 2014-041859 A | 3/2014 |

OTHER PUBLICATIONS

English Translation of Chinese Search Report dated Jan. 22, 2019 for the related Chinese Patent Application No. 201611258390.8.

* cited by examiner

*Primary Examiner* — Michael C McCullough
(74) *Attorney, Agent, or Firm* — Pearne & Gordon LLP

(57) ABSTRACT

According to a tape feeder of the present disclosure, a tape pressing member pressing a part which engages with an outer peripheral tooth of a sprocket in a carrier tape from above is connected to a main body by a connection mechanism. The connection mechanism is configured to move the entirety of the tape pressing member in a manner parallel to the main body in a case where a portion of the tape pressing member moves in a vertical direction with respect to the main body.

2 Claims, 10 Drawing Sheets

L1=L2=L3 and T1//T2//T3

TAPE FEEDER

BACKGROUND

1. Technical Field

The present disclosure relates to a tape feeder which causes a carrier tape holding a component to travel on a tape traveling path so as to supply the component to a pick-up position of a component mounter.

2. Description of the Related Art

In the related art, tape feeders become known as a representative type of component supplier in a component mounter. The component mounter is a device which installs a component in a board by sucking the component with a suction nozzle, and the tape feeder supplies the component to a pick-up position of the component mounter by performing pitch feeding of a carrier tape holding the component. The tape feeder includes a main body that is attached to the component mounter and has a tape traveling path which is a traveling path of the carrier tape; and a sprocket that is attached to the main body, causes an outer peripheral tooth to engage with a feed hole of the carrier tape, and rotates so as to perform pitch feeding of the carrier tape on the tape traveling path. A part which engages with the outer peripheral tooth of the sprocket in the carrier tape is pressed by a tape pressing member from above. A component positioned at the pick-up position is picked up by being sucked with the suction nozzle through a component supply opening provided in the tape pressing member.

In such a tape feeder, the tape pressing member is uniformly biased downward (main body side) throughout a longitudinal direction (traveling direction of the carrier tape) by a biasing member. The carrier tape is pressed downward by receiving uniform force from the tape pressing member (for example, refer to Japanese Patent Unexamined Publication No. 2014-41859). Therefore, the outer peripheral tooth of the sprocket firmly fits in the feed hole of the carrier tape, and thus, feed control of the carrier tape can be performed based on a rotative position of the sprocket.

SUMMARY

According to the present disclosure, a tape feeder performs pitch feeding of a carrier tape holding a component so as to supply the component to a pick-up position for a suction nozzle included in a component mounter. According to the present disclosure, the tape feeder includes a main body that has a tape traveling path which is a traveling path of the carrier tape; a sprocket that is provided in the main body, causes an outer peripheral tooth to engage with a feed hole of the carrier tape, and rotates so as to perform pitch feeding of the carrier tape on the tape traveling path; a tape pressing member that is provided in the main body and presses a part which engages with the outer peripheral tooth of the sprocket in the carrier tape from above; and a connection mechanism that connects the tape pressing member to the main body and moves an entirety of the tape pressing member in a manner parallel to the main body in a case where a portion of the tape pressing member moves in a vertical direction with respect to the main body.

DETAILED DESCRIPTION

Before describing an exemplary embodiment of the present disclosure, problems of tape feeders in the related art will be simply described.

In the aforementioned tape feeders in the related art, in a case where a part in which a carrier tape is locally significant in thickness (for example, a part in which a splicing tape is pasted) enters a region below a tape pressing member (a region between the tape pressing member and a tape traveling path), the rear end of the tape pressing member is pushed up by the part in which the carrier tape is significant in thickness, and the tape pressing member is in a posture tilting in a longitudinal direction. Therefore, force pressing the carrier tape is no longer uniform throughout the longitudinal direction of the tape pressing member, and an outer peripheral tooth of a sprocket does not firmly fit in a feed hole of the carrier tape. Thus, there is concern that feed control of the carrier tape may not be accurately performed. In addition, in a case where the splicing tape cannot be pierced with the outer peripheral tooth of the sprocket, there is concern that the sprocket may run idle with respect to the carrier tape resulting in transport jamming.

Exemplary Embodiment

Figure 1:
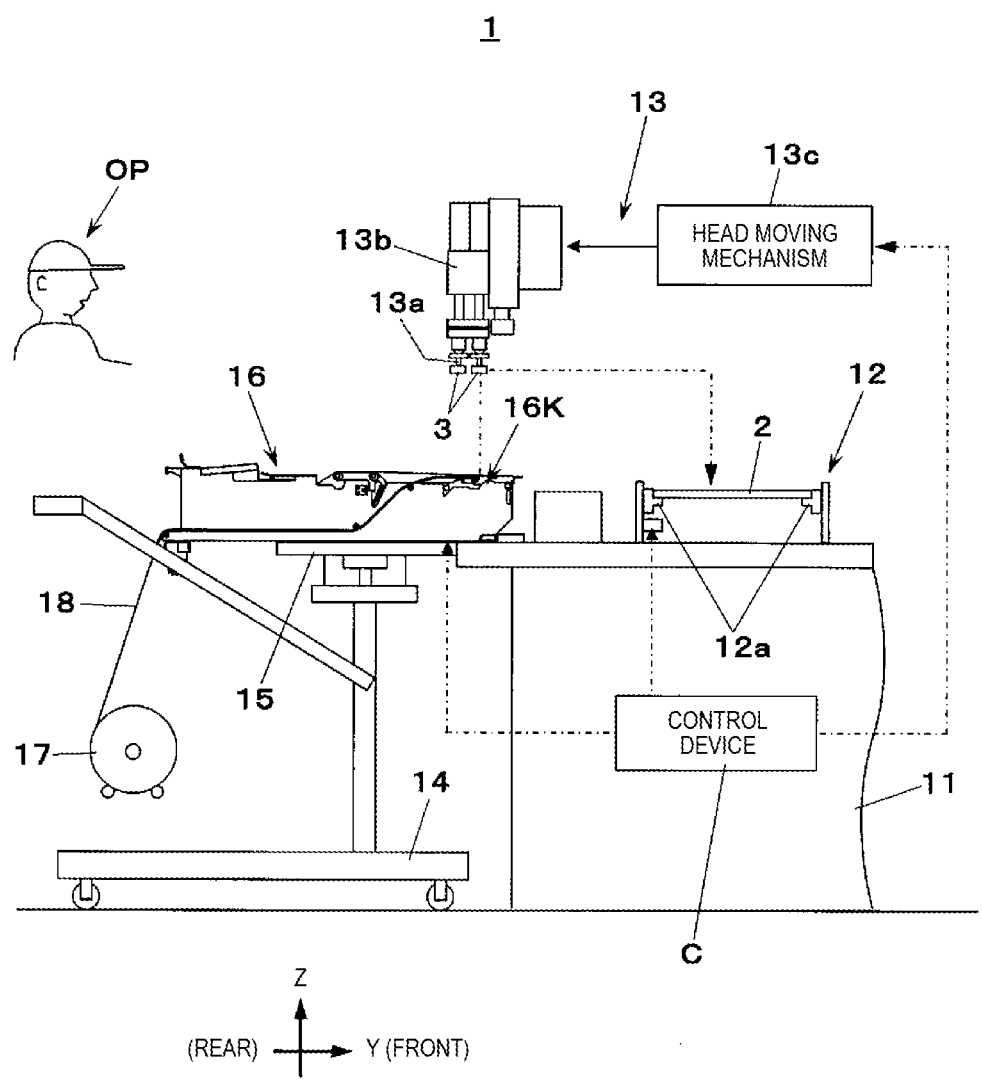
FIG. 1 is a side view of a component mounter having a tape feeder of an exemplary embodiment of the present disclosure.

Hereinafter, the exemplary embodiment of the present disclosure will be described with reference to the drawings. Component mounter 1 illustrated in FIG. 1 is a device which mounts component 3 in board 2. Component mounter 1 has board transporter 12 and component installer 13 on base 11.

Figure 2:
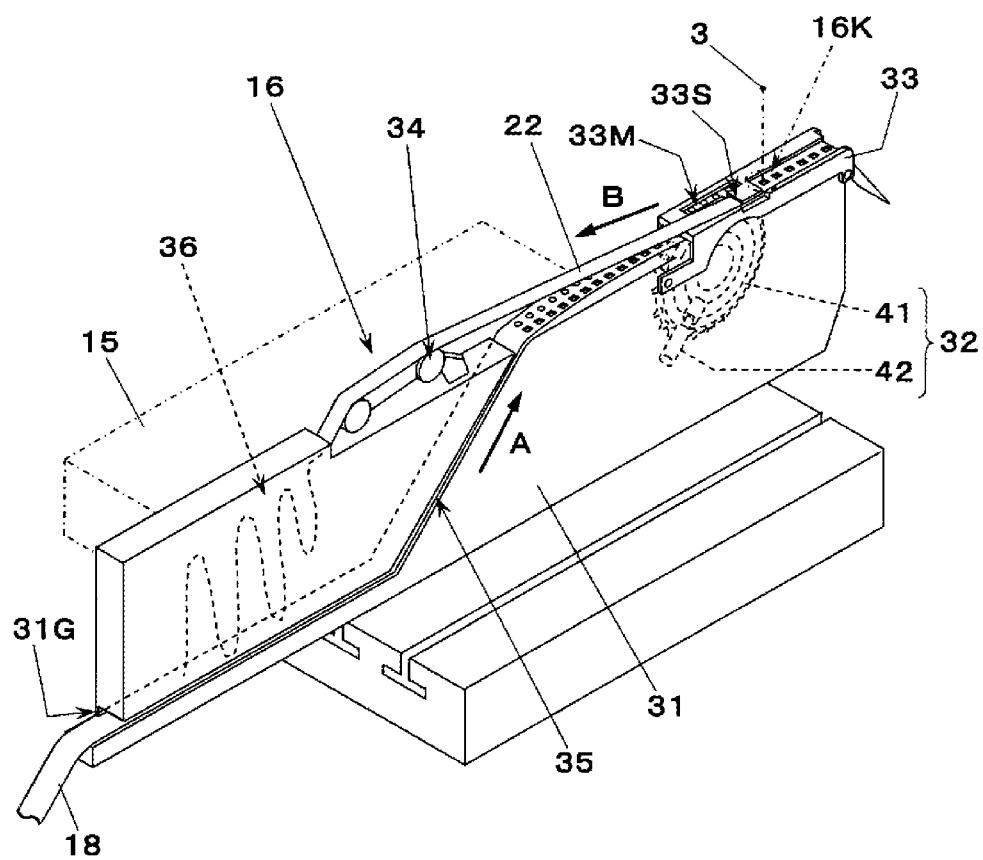
FIG. 2 is a perspective view of the tape feeder of the exemplary embodiment of the present disclosure.
Figure 2:
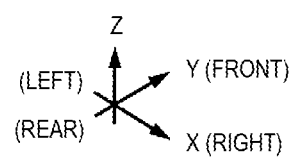

Feeder base 15 moved by carriage 14 is connected to base 11, and tape feeder 16 is attached to feeder base 15 (FIG. 2).

In FIG. 1, board transporter 12 is formed to have pair of conveyers 12*a* disposed in a Y-axis direction (forward-rearward direction when viewed from worker OP), and board transporter 12 transports board 2 in an X-axis direction (transverse direction when viewed from worker OP). Component installer 13 is configured to include installation head 13*b* having suction nozzle 13*a*, and head moving mechanism 13*c* moving installation head 13*b* in the in-horizontal plane direction. Installation head 13*b* can move suction nozzle 13*a* in a Z-axis direction (vertical direction), and installation head 13*b* can rotate suction nozzle 13*a* around a Z-axis.

Multiple tape feeders 16 are attached to feeder base 15 so as to be arranged in the X-axis direction. As illustrated in FIG. 1, carrier tape 18 drawn out from reel 17 held in carriage 14 is introduced to each tape feeder 16 (also refer to FIG. 2). Carrier tape 18 holds component 3, and each tape feeder 16 performs pitch feeding of carrier tape 18, thereby intermittently supplying component 3 held by carrier tape 18 to pick-up position 16K of component 3 for suction nozzle 13*a*.

Figure 3:
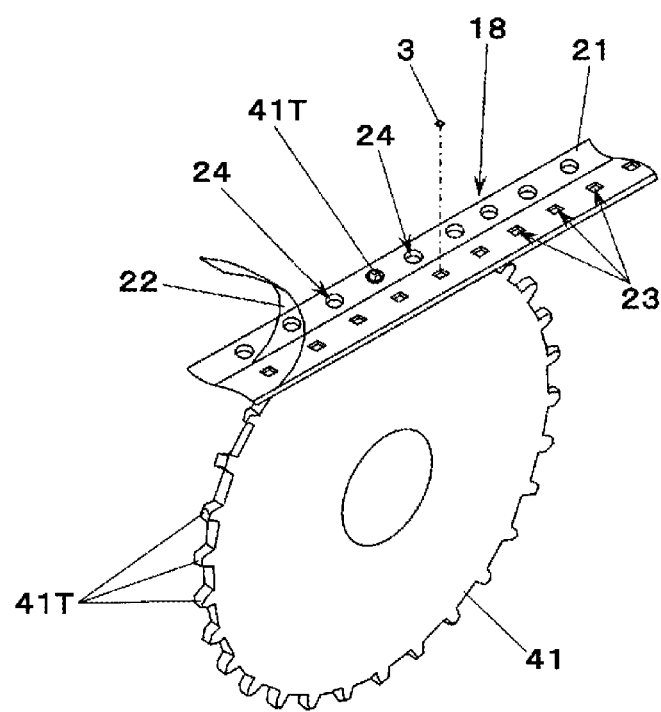
FIG. 3 is a perspective view of a carrier tape which is used in the tape feeder of the exemplary embodiment of the present disclosure and is illustrated together with a portion of the tape feeder.

As illustrated in FIG. 3, carrier tape 18 has a configuration in which transparent cover tape 22 is pasted on the top surface of base tape 21. Multiple component storages 23 are provided in base tape 21 so as to be arranged in line, and component 3 is stored in each component storage 23. Cover tape 22 covers each component storage 23 from above so as to prevent component 3 from falling off from component storage 23. Feed holes 24 are provided at a position parallel to the line of component storages 23 in base tape 21 so as to be arranged in line.

Figure 4:
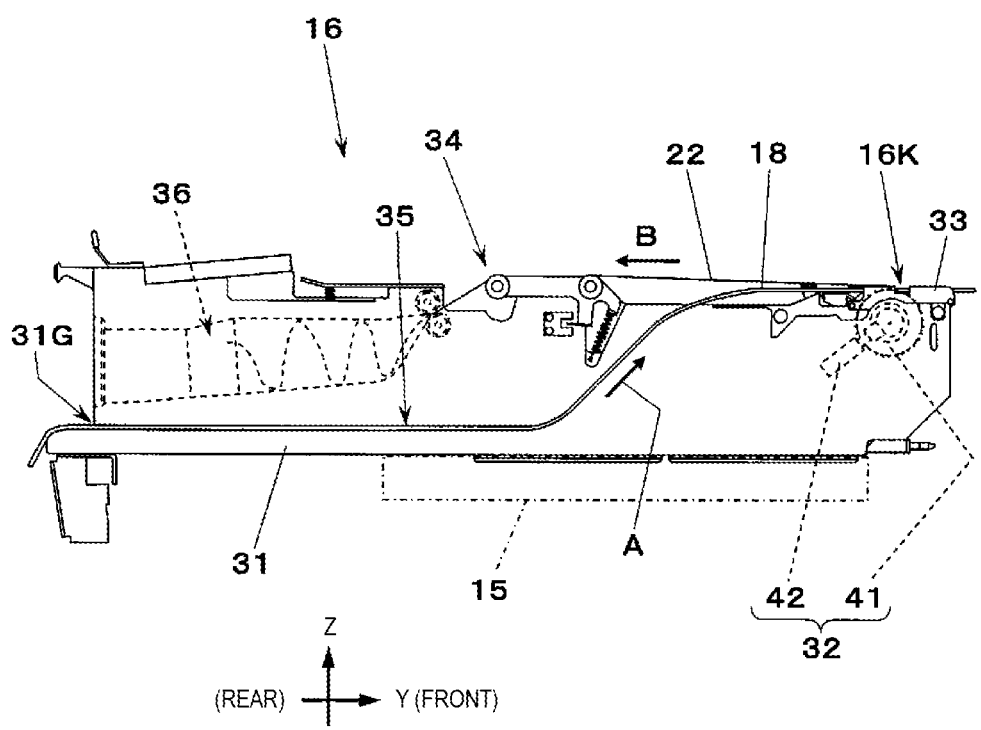
FIG. 4 is a side view of the tape feeder of the exemplary embodiment of the present disclosure.

As illustrated in FIGS. 2 and 4, in tape feeder 16, tape traveling mechanism 32, tape pressing member 33, and cover tape collecting mechanism 34 are included in main body 31 which is attachably/detachably installed in feeder base 15. Tape traveling path 35 which is a traveling path of carrier tape 18 is provided in main body 31. In the present exemplary embodiment, tape traveling path 35 extends horizontally to the front from tape introduction port 31G (FIGS. 2 and 4) formed in a rear end lower part of main body 31. Thereafter, tape traveling path 35 extends obliquely upward to the front at an intermediate part of main body 31, and tape traveling path 35 extends forward from main body 31 in a state of being exposed on the top surface of main body 31.

In FIGS. 2 and 4, tape traveling mechanism 32 has sprocket 41 which is provided at a position upward to the front from main body 31, and drive motor 42 which intermittently drives sprocket 41 to rotate around an X-axis. Sprocket 41 rotates while causing outer peripheral teeth 41T (FIG. 3) to respectively engage with feed holes 24 of carrier tape 18, thereby performing pitch feeding of carrier tape 18 on tape traveling path 35 (arrow A indicated in FIGS. 2 and 4). Accordingly, carrier tape 18 intermittently causes component storages 23 (that is, components 3) to be positioned at pick-up position 16K.

Figure 5:
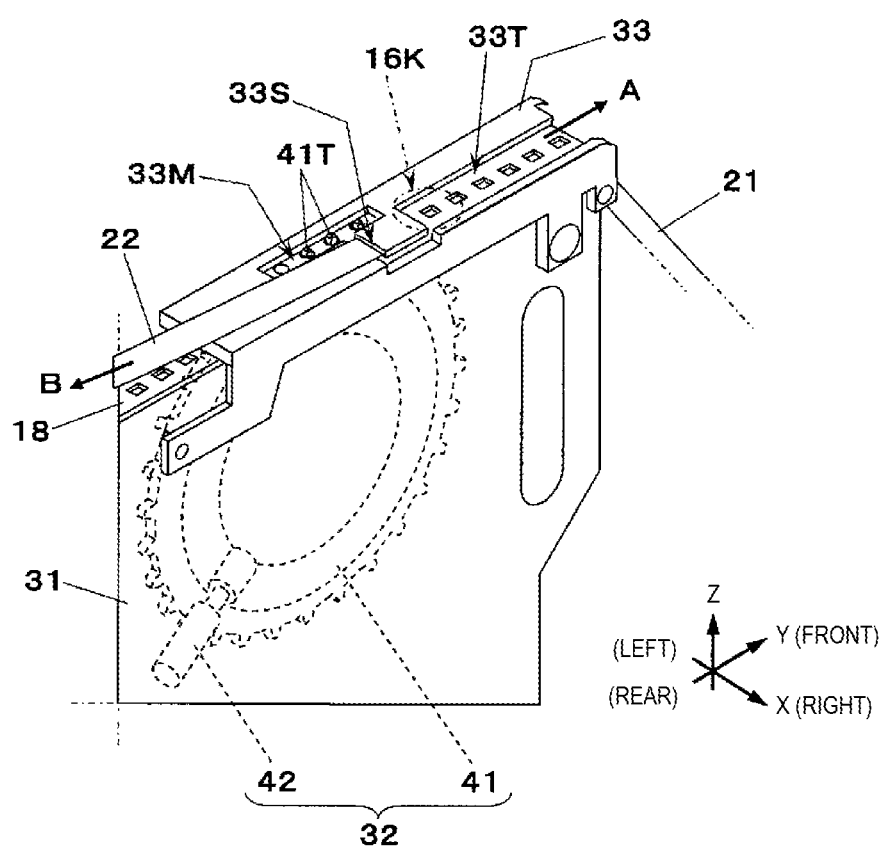
FIG. 5 is a perspective view of the portion of the tape feeder of the exemplary embodiment of the present disclosure.

In FIGS. 2 and 4, tape pressing member 33 is provided so as to extend in a manner parallel to tape traveling path 35 positioned immediately below at a position upward to the front from main body 31. Tape pressing member 33 covers a part in which outer peripheral teeth 41T of sprocket 41 engage (a region in the vicinity of pick-up position 16K) in carrier tape 18 traveling tape traveling path 35, and tape pressing member 33 presses carrier tape 18 of the part from above. As illustrated in FIG. 5, tape pressing member 33 is provided with component supply opening 33T which is provided so as to open the top of component storage 23 positioned at pick-up position 16K, slit 33S for drawing out peeled-off cover tape 22, and groove 33M for avoiding interference with outer peripheral teeth 41T of sprocket 41. Slit 33S is positioned at the rear of component supply opening 33T.

After a portion of cover tape 22 on the lead side is peeled off in advance from base tape 21 by worker OP, cover tape 22 is drawn out upward to the rear through slit 33S (FIGS. 2, 4, and 5), and cover tape 22 is introduced to cover tape collecting mechanism 34 provided at a position above an intermediate part of main body 31. Cover tape collecting mechanism 34 intermittently pulls cover tape 22 in response to tape traveling mechanism 32 performing pitch feeding of carrier tape 18 (arrow B indicated in FIGS. 2, 4, and 5), and cover tape collecting mechanism 34 contains pulled cover tape 22 inside cover tape container 36 which is formed at the rear inside main body 31. Therefore, cover tape 22 is peeled off from base tape 21 while having slit 33S as a peeling-off position. At the point of time when component storage 23 arrives at pick-up position 16K, component storage 23 is in an exposed state, not covered with cover tape 22. Accordingly, installation head 13*b* can pick up component 3 positioned at pick-up position 16K by sucking component 3 with suction nozzle 13*a*.

In component mounter 1 having the above-described configuration, control device C (FIG. 1) included in component mounter 1 performs operational control of board transporter 12, component installer 13, tape feeder 16, and the like. Board transporter 12 controlled by control device C firstly carries in board 2 sent from the upstream process side such that board 2 is positioned at a work position. Tape feeder 16 is operated so as to supply component 3 to pick-up position 16K, and head moving mechanism 13*c* causes installation head 13*b* to reciprocate between tape feeder 16 and board 2. Installation head 13*b* uses suction nozzle 13*a* to pick up component 3 positioned at pick-up position 16K by tape feeder 16, through component supply opening 33T, and installation head 13*b* installs picked-up component 3 in board 2. When all components 3 to be installed in board 2 are installed in board 2 by installation head 13*b*, board transporter 12 carries out board 2 to the downstream process side.

In the present exemplary embodiment, in tape feeder 16 which is applied to component mounter 1 having such a configuration, there is a distinct feature in the configuration related to tape pressing member 33, and description thereof will be given below.

Figure 6:
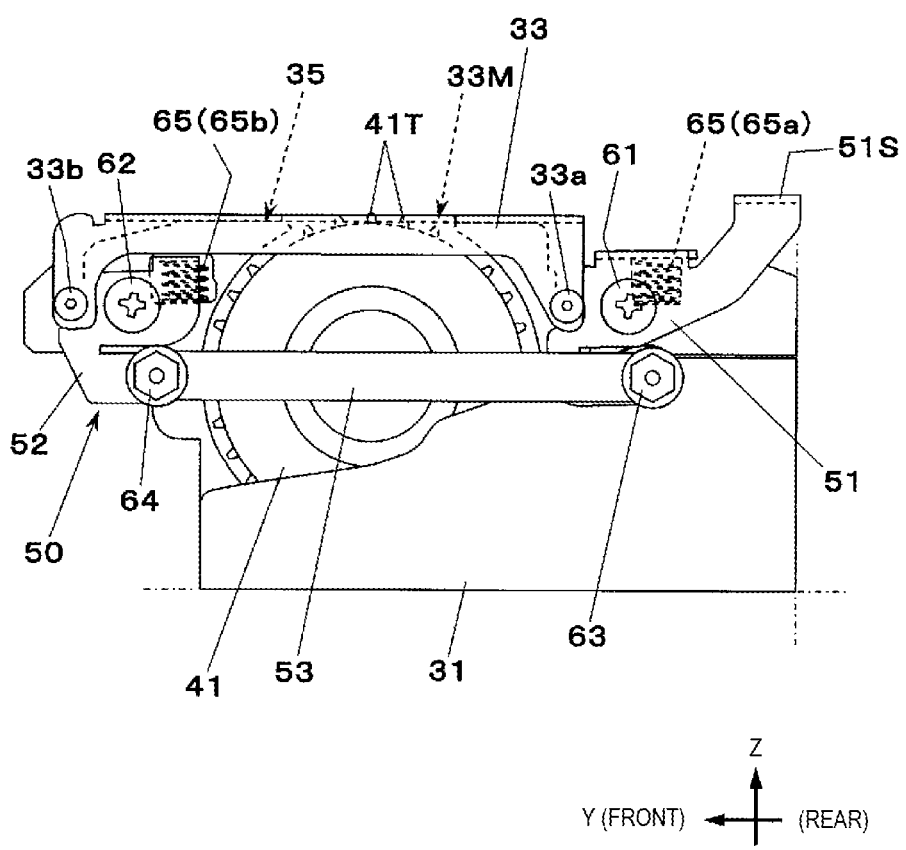
FIG. 6 is a side view of the tape feeder of the exemplary embodiment of the present disclosure.
Figure 7:
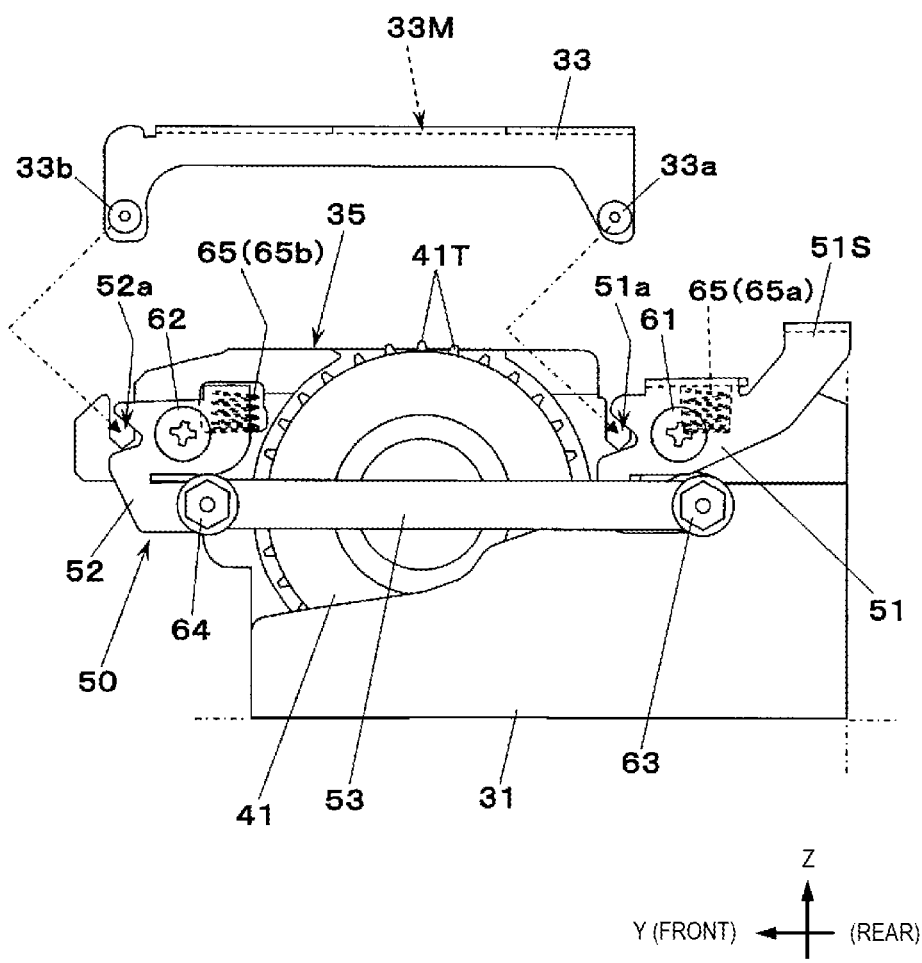
FIG. 7 is a partially exploded side view of the tape feeder of the exemplary embodiment of the present disclosure.

In FIGS. 6 and 7, tape pressing member 33 is connected to main body 31 by connection mechanism 50 which is provided on a side surface of main body 31 on one side. Connection mechanism 50 has rear swing member 51 (first link member), front swing member 52 (second link member), and connection member 53 (third link member).

Rear swing member 51 is attached to main body 31 by first pivotal link member 61 so as to swing freely around the X-axis while having first pivotal link member 61 as the swing center. Notched rear lock 51*a* is provided at a position in front of the swing center with respect to main body 31 of rear swing member 51 (FIG. 7). Rear lock pin 33*a* provided in the rear end of tape pressing member 33 (end on the opposite side in a traveling direction of carrier tape 18) is locked in rear lock 51*a*. In this manner, rear swing member 51 is a member which is attached to main body 31 so as to swing freely and is connected to an end of tape pressing member 33 on the opposite side in the traveling direction of carrier tape 18.

Front swing member 52 is attached to main body 31 by second pivotal link member 62 so as to swing freely around the X-axis while having second pivotal link member 62 as the swing center. Notched front lock 52a is provided at a position in front of the swing center with respect to main body 31 of front swing member 52 (FIG. 7). Front lock pin 33b provided in the front end of tape pressing member 33 (end on a side in the traveling direction of carrier tape 18) is locked in front lock 52a. In this manner, front swing member 52 is a member which is attached to main body 31 so as to swing freely and is connected to an end of tape pressing member 33 on a side in the traveling direction of carrier tape 18.

Third pivotal link member 63 is attached at a position downward to the rear from the swing center with respect to main body 31 of rear swing member 51, and fourth pivotal link member 64 is attached at a position downward to the rear from the swing center with respect to main body 31 of front swing member 52. In connection member 53, the rear end (end on one side) is pivotally linked to third pivotal link member 63 and the front end (end on the other side) is pivotally linked to fourth pivotal link member 64. In this manner, connection member 53 is a member in which an end on one side is connected to rear swing member 51 by third pivotal link member 63 and an end on the other side is connected to front swing member 52 by fourth pivotal link member 64.

Figure 8:
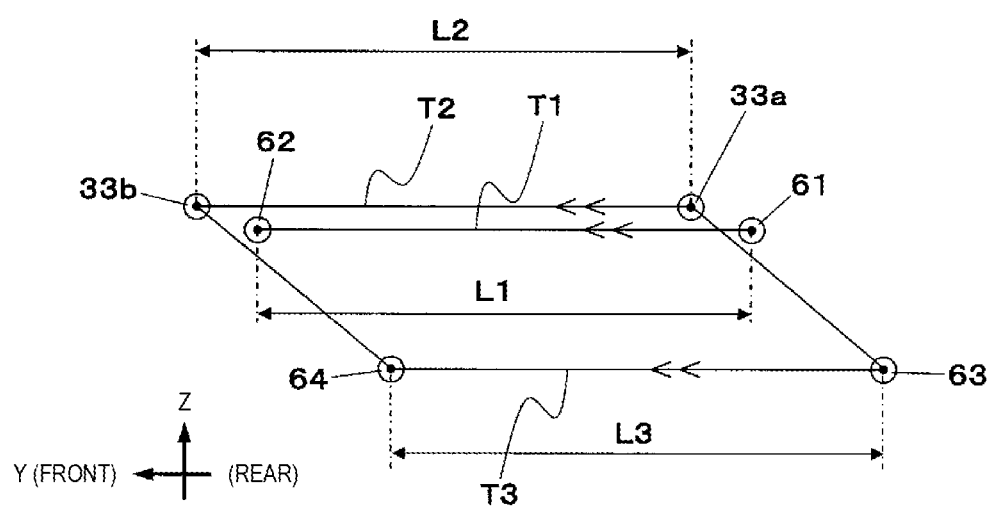
FIG. 8 is a view illustrating a relationship between positions and lengths of a tape pressing member and a connection member which are included in the tape feeder of the exemplary embodiment of the present disclosure.

As illustrated in FIG. 8, gap L1 between first pivotal link member 61 and second pivotal link member 62, gap L2 between rear lock pin 33a and front lock pin 33b, and gap L3 between third pivotal link member 63 and fourth pivotal link member 64 are equal to each other. In addition, segment T1 connecting first pivotal link member 61 and second pivotal link member 62, segment T2 connecting rear lock pin 33a and front lock pin 33b, and segment T3 connecting third pivotal link member 63 and fourth pivotal link member 64 are parallel to each other. Thus, tape pressing member 33, rear swing member 51, front swing member 52, and connection member 53 configure a parallel link having first pivotal link member 61 and second pivotal link member 62 as a steady point (swing fulcrum). In a case where a portion of tape pressing member 33 moves in the vertical direction with respect to main body 31, connection member 53 moves the entirety of tape pressing member 33 in a manner parallel to main body 31.

In FIG. 6, a part positioned upward to the rear from a pivotal link toward main body 31 of rear swing member 51 is pushed up by biasing member 65 (rearward compression spring 65a) provided in main body 31. Therefore, rear swing member 51 is in a state of being biased in the downward direction to the front around first pivotal link member 61 (direction in which rear lock 51a is lowered). In addition, in FIG. 6, a part positioned upward to the rear from the pivotal link toward main body 31 of front swing member 52 is pushed up by biasing member 65 (forward compression spring 65b) provided in main body 31. Therefore, front swing member 52 is in a state of being biased in the downward direction to the front around second pivotal link member 62 (direction in which front lock 52a is lowered).

As described above, since both rear swing member 51 and front swing member 52 are biased in the downward direction to the front, downward biasing force acts on tape pressing member 33. Therefore, carrier tape 18 positioned immediately below tape pressing member 33 is pressed to tape traveling path 35 by tape pressing member 33 with force uniform throughout the longitudinal direction of tape pressing member 33.

Figure 9A:
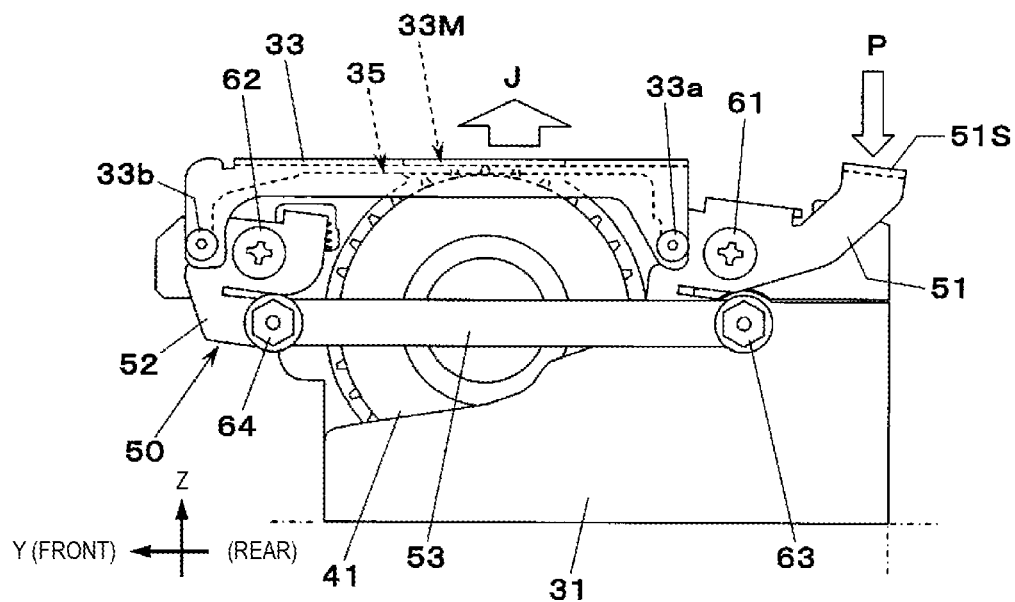
FIG. 9A is a view describing an operation of the tape pressing member and a connection mechanism which are included in the tape feeder of the exemplary embodiment of the present disclosure.

In FIGS. 6 and 7, swing operation unit 51S is provided in the rear end of rear swing member 51. When worker OP presses swing operation unit 51S downward (from FIG. 9A to FIG. 9B, arrow P indicated in the views), rear swing member 51 swings around first pivotal link member 61. A swing direction of first pivotal link member 61 in this case is a direction opposite (direction upward to the front) to the downward direction to the front in which biasing member 65 biases tape pressing member 33, and rear swing member 51 is operated against the biasing force of biasing member 65.

Figure 9B:
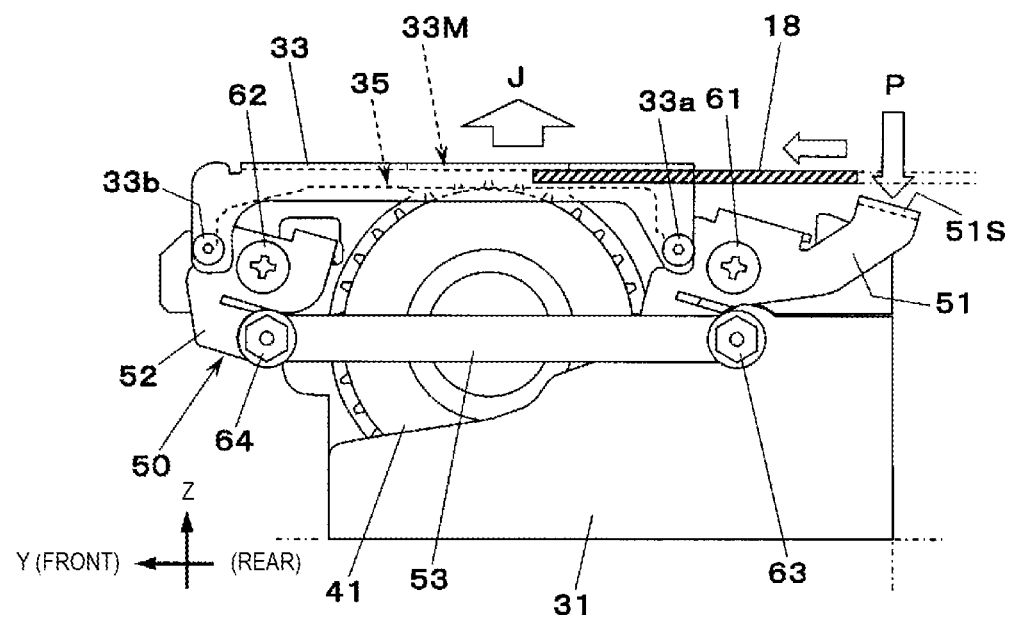
FIG. 9B is a view describing an operation of the tape pressing member and the connection mechanism which are included in the tape feeder of the exemplary embodiment of the present disclosure.

When rear swing member 51 swings in the upward direction to the front in response to the operation of swing operation unit 51S, the rear end (rear lock pin 33a) of tape pressing member 33 is lifted by rear swing member 51. In this case, since tape pressing member 33 and connection mechanism 50 configure a parallel link, tape pressing member 33 rises by moving in a manner parallel to main body 31 (from FIG. 9A to FIG. 9B, arrow J indicated in the views). A space having a height constant throughout the longitudinal direction of tape pressing member 33 is formed between tape pressing member 33 and tape traveling path 35 immediately below thereof. Therefore, worker OP can easily carry out work of setting carrier tape 18 to sprocket 41 (work of causing feed holes 24 of carrier tape 18 to respectively engage with outer peripheral teeth 41T of sprocket 41) (FIG. 9B).

After worker OP sets carrier tape 18 to tape feeder 16, carrier tape 18 travels on tape traveling path 35 in accordance with rotations of sprocket 41, and tape pressing member 33 presses carrier tape 18 traveling immediately below thereof. In this case, since force with which tape pressing member 33 presses carrier tape 18 is uniform throughout the longitudinal direction of tape pressing member 33, outer peripheral teeth 41T of sprocket 41 firmly fit in feed holes 24 of carrier tape 18, and thus, accurate feed control of carrier tape 18 can be performed.

Figure 10A:
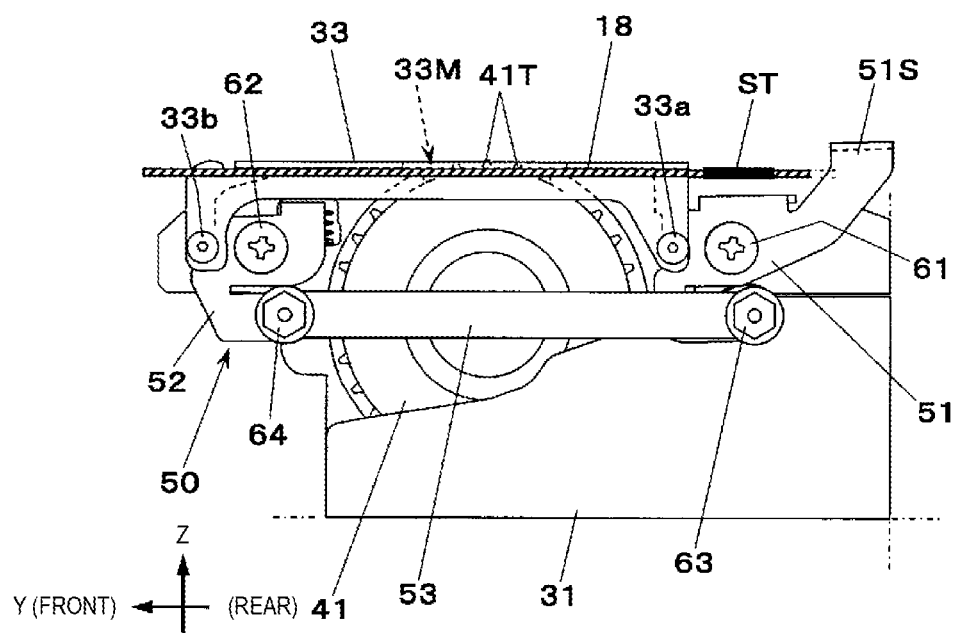
FIG. 10A is a view describing an operation of the tape pressing member and the connection mechanism which are included in the tape feeder of the exemplary embodiment of the present disclosure.
Figure 10B:
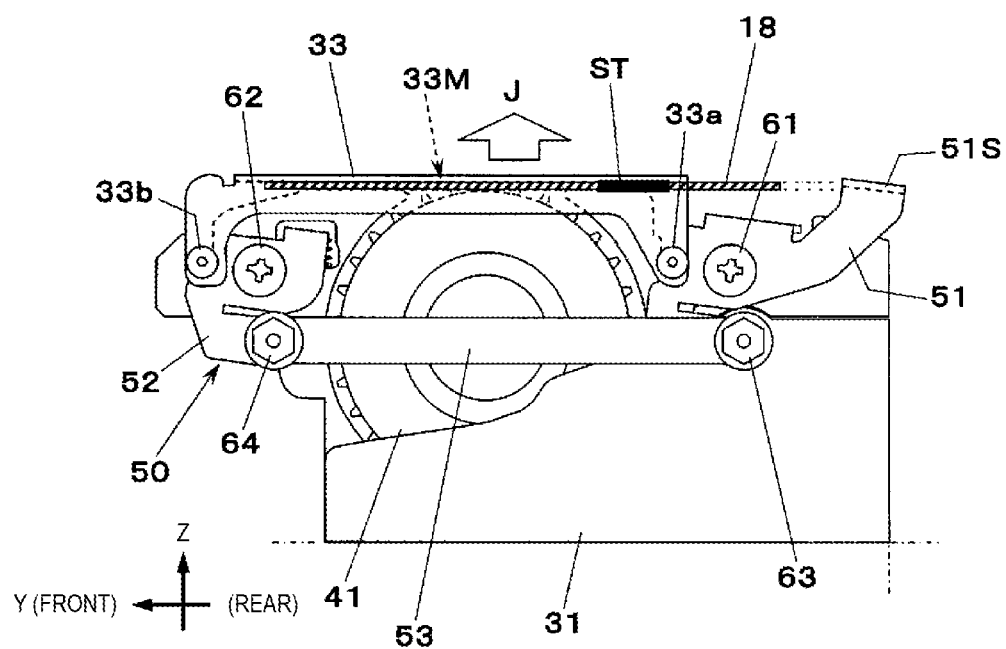
FIG. 10B is a view describing an operation of the tape pressing member and the connection mechanism which are included in the tape feeder of the exemplary embodiment of the present disclosure.

Here, in a case where part ST in which carrier tape 18 is locally significant in thickness, for example, a spot in which a splicing tape of carrier tape 18 is pasted, enters a region immediately below tape pressing member 33 (region between tape pressing member 33 and tape traveling path 35), tape pressing member 33 rises with respect to tape traveling path 35 (that is, with respect to main body 31) as much as the increased quantity of the thickness (from FIG. 10A to FIG. 10B, arrow J indicated in FIG. 10B). Consequently, since the entirety of tape pressing member 33 rises by moving in a manner parallel to main body 31 as much as the risen quantity thereof, carrier tape 18 can be maintained in a state of being pressed by tape pressing member 33 with uniform force. Therefore, even in a case where part ST in which carrier tape 18 is locally significant in thickness enters the region immediately below tape pressing member 33, outer peripheral teeth 41T of sprocket 41 firmly fit in feed holes 24 of carrier tape 18, and thus, accurate feed control of carrier tape 18 continues.

As described above, in tape feeder 16 of the present exemplary embodiment, in a case where a portion of tape pressing member 33 moves in the vertical direction with respect to main body 31, connection mechanism 50 connecting tape pressing member 33 to main body 31 moves the entirety of tape pressing member 33 in a manner parallel to main body 31. Therefore, even if there is part ST in which carrier tape 18 is locally significant in thickness, tape pressing member 33 is not in a posture tilting in the longitudinal direction, and carrier tape 18 is pressed by tape pressing member 33 with uniform force. Accordingly, outer peripheral teeth 41T of sprocket 41 can firmly fit in feed holes 24 of carrier tape 18, and thus, accurate feed control of carrier tape 18 can be performed.

It is possible to provide a tape feeder which can perform accurate feed control of a carrier tape even if there is a part in which a carrier tape is locally significant in thickness.

What is claimed is:

1. A tape feeder which performs pitch feeding of a carrier tape holding a component so as to supply the component to a pick-up position for a suction nozzle included in a component mounter, the tape feeder comprising:
    a main body that has a tape traveling path which is a traveling path of the carrier tape;
    a sprocket that is provided in the main body, causes an outer peripheral tooth to engage with a feed hole of the carrier tape, and rotates so as to perform pitch feeding of the carrier tape on the tape traveling path;
    a tape pressing member that is provided in the main body and presses a part which engages with the outer peripheral tooth of the sprocket in the carrier tape from above; and
    a connection mechanism that connects the tape pressing member to the main body,
    wherein the connection mechanism includes a first link member which is attached to the main body by a first pivotal link member so as to swing freely around the first pivotal link member as a swing center and is connected by a first lock pin to an end of the tape pressing member on an opposite side in a traveling direction of the carrier tape, a second link member which is attached to the main body by a second pivotal link member so as to swing freely around the second pivotal link member as a swing center and is connected by a second lock pin to an end of the tape pressing member on a side in the traveling direction of the carrier tape, and a third link member of which an end on one side is connected to the first link member by a third pivotal link member and of which an end on the other side is connected to the second link member by a fourth pivotal link member, and wherein a segment connecting the first pivotal link member and the second pivotal link member, a segment connecting the first lock pin and the second lock pin, and a segment connecting the third pivotal link member and the fourth pivotal link member are parallel to each other.

2. The tape feeder of claim 1, further comprising: a swing operation unit that causes the first link member to swing with respect to the main body.

* * * * *